(12) United States Patent
Lim et al.

(10) Patent No.: US 10,488,723 B2
(45) Date of Patent: Nov. 26, 2019

(54) DISPLAY DEVICE AND METHOD FOR FABRICATING DISPLAY DEVICE

(71) Applicant: Samsung Display Co., Ltd., Yongin-si, Gyeonggi-do (KR)

(72) Inventors: Sang Hoon Lim, Cheonan-si (KR); Sung Jin Jang, Daejeon (KR); Yeol Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 91 days.

(21) Appl. No.: 15/813,714

(22) Filed: Nov. 15, 2017

(65) Prior Publication Data
US 2018/0143499 A1 May 24, 2018

(30) Foreign Application Priority Data
Nov. 22, 2016 (KR) .................. 10-2016-0155529

(51) Int. Cl.
G02F 1/1362 (2006.01)
G02F 1/1333 (2006.01)
G02F 1/1335 (2006.01)
H01L 51/52 (2006.01)
H01L 51/56 (2006.01)
H01L 27/32 (2006.01)

(52) U.S. Cl.
CPC .. G02F 1/136209 (2013.01); G02F 1/133308 (2013.01); G02F 1/133617 (2013.01); H01L 27/3211 (2013.01); H01L 51/5246 (2013.01); H01L 51/56 (2013.01); G02F 1/133512 (2013.01); *G02F 2001/133331* (2013.01); *G02F 2202/28* (2013.01); *H01L 27/3272* (2013.01)

(58) Field of Classification Search
CPC ......... G02F 1/136209; G02F 1/133308; G02F 1/133617; H01L 27/3211; H01L 51/5246; H01L 51/56; B32B 7/12; B32B 37/12; B32B 37/1207; B32B 37/1284; B32B 2037/1215; B32B 2037/1223; B32B 2037/1253
See application file for complete search history.

(56) References Cited

U.S. PATENT DOCUMENTS 9,851,594 B2 * 12/2017 Miyashita ......... G02F 1/133308
2006/0292724 A1 * 12/2006 Nakamura ............ H01L 25/048
438/29
(Continued)

FOREIGN PATENT DOCUMENTS

JP 2014-211584 A 11/2014
JP 2015-26065 A 2/2015
(Continued)

*Primary Examiner* — Sardis F Azongha
(74) *Attorney, Agent, or Firm* — Lewis Roca Rothgerber Christie LLP

(57) ABSTRACT

A display device includes a display panel, a window on the display panel, and an adhesive member between the display panel and the window, wherein the window includes a base substrate and a light-shielding pattern layer, the base substrate including a first region overlapping the display panel, and a second region extending and protruding outward from the display panel, the light-shielding pattern layer being on the first region and the second region and including a groove adjacent to an outer surface of the display panel.

19 Claims, 20 Drawing Sheets

(56) References Cited

U.S. PATENT DOCUMENTS

| | | | | |
|---|---|---|---|---|
| 2012/0318064 A1* | 12/2012 | Kaack | ............... | G01N 29/043 |
| | | | | 73/588 |
| 2014/0267989 A1* | 9/2014 | Kondo | ............. | G02F 1/133308 |
| | | | | 349/110 |
| 2015/0014644 A1* | 1/2015 | Namkung | ........... | H01L 51/0097 |
| | | | | 257/40 |
| 2015/0169089 A1* | 6/2015 | Dixon | ............... | H04B 1/3888 |
| | | | | 428/137 |
| 2016/0170257 A1* | 6/2016 | Zhang | ............... | B32B 37/003 |
| | | | | 349/58 |
| 2016/0341887 A1* | 11/2016 | Fang | ................... | G02B 6/0088 |
| 2016/0377914 A1* | 12/2016 | Miyashita | ......... | G02F 1/133608 |
| | | | | 349/110 |

FOREIGN PATENT DOCUMENTS

| | | |
|---|---|---|
| KR | 0151852 B1 | 12/1998 |
| KR | 10-2010-0082438 A | 7/2010 |
| KR | 10-1251204 B1 | 4/2013 |
| KR | 10-2015-0009704 A | 1/2015 |

* cited by examiner

DISPLAY DEVICE AND METHOD FOR FABRICATING DISPLAY DEVICE

CROSS-REFERENCE TO RELATED APPLICATION

This application claims priority from and the benefit of Korean Patent Application No. 10-2016-0155529, filed on Nov. 22, 2016, in the Korean Intellectual Property Office, the disclosure of which is incorporated herein by reference in its entirety.

BACKGROUND

1. Field

The present invention relates to a display device and a method for fabricating the display device.

2. Description of the Related Art

The display device is a device that displays an image, using an organic light-emitting display panel, a liquid crystal panel, or the like. The display device is applied to a TV, a monitor, a notebook computer, a tablet PC, a smartphone, a mobile phone, and the like.

The display device may include a window for protecting the display panel. Because portable tablet PCs, smart phones, and the like are used while mobile rather than being fixedly installed, they are frequently exposed to the external environment. Further, when a touch function is added, because they are continuously exposed to external forces, a function of a window is further important.

Normally, the window is attached to the display panel by an adhesive member, and it is desirable that the adhesive member be suitably applied so that the window and the display panel are not detached from each other.

SUMMARY

Checking whether the adhesive member is suitably applied helps to reduce the failure rate of the display device. In order to check the filling of the adhesive member, the completed display device may be cut at a specific point and the cut surface may be analyzed. However, it may take a long time to analyze the cut surface, only the specific cut points may be analyzed, and it may be difficult to reuse the cut display device.

An aspect of the present invention is directed to a display device in which the filling degree of the adhesive member may be easily checked.

Another aspect of the present invention is directed to a method for fabricating the display device capable of easily checking the filling degree of the adhesive member.

The aspects of the present invention are not limited to the technical issues mentioned above. Indeed, other technical issues addressed by the present invention, but not mentioned above, may be clearly understood by those skilled in the art from the description below.

According to an embodiment of the present invention, there is provided a display device including: a display panel; a window on the display panel; and an adhesive member between the display panel and the window, wherein the window includes a base substrate and a light-shielding pattern layer, the base substrate including a first region overlapping the display panel, and a second region extending and protruding outward from the display panel, the light-shielding pattern layer being on the first region and the second region and including a groove adjacent to an outer surface of the display panel.

In an embodiment, the groove extends linearly along the outer surface of the display panel.

In an embodiment, the display panel has a rectangular shape, and the groove extends along at least one side of the rectangular shape.

In an embodiment, a width of the groove is 1 µm to 100 µm, and a depth of the groove is 0.1 µm or more and is less than a thickness of the light-shielding pattern layer.

In an embodiment, the groove includes an inner wall and an outer wall, the inner wall of the groove being aligned with the outer surface of the display panel.

In an embodiment, a tip of the adhesive member overlaps at least part of the groove.

In an embodiment, the window has one surface facing the display panel, and an other surface opposite to the one surface, the light-shielding pattern layer being on the one surface of the window.

In an embodiment, the display panel includes a first substrate, and a second substrate facing the first substrate and spaced from the first substrate.

In an embodiment, the display panel includes an organic light-emitting element.

In an embodiment, the adhesive member includes an optically clear resin (OCR).

According to an embodiment of the present invention, there is provided a method for fabricating a display device, the method including: preparing a window including a base substrate, and a light-shielding pattern layer on a peripheral portion of the base substrate; forming a groove on the light-shielding pattern layer; and laminating a display panel and the window via an adhesive member to form a laminate, wherein the base substrate of the laminate includes a first region overlapping the display panel, and a second region extending and protruding outward from the display panel, wherein the light-shielding pattern layer of the laminate is on the first region and the second region, and wherein the groove of the light-shielding pattern layer of the laminate is aligned with an outer surface of the display panel.

In an embodiment, forming the groove includes irradiating a laser on the basis of the outer surface of the display panel.

In an embodiment, forming the groove includes formation of a scratch, using a knife, on the basis of the outer surface of the display panel.

In an embodiment, the groove is formed linearly along the outer surface of the display panel.

In an embodiment, the display panel has a rectangular shape, and the groove extends along at least one side of the rectangular shape.

In an embodiment, a width of the groove is 1 µm to 100 µm, and a depth of the groove is 0.1 µm or more and is less than a thickness of the light-shielding pattern layer.

In an embodiment, the window has one surface facing the display panel, and an other surface opposite to the one surface, and the method further includes acquiring data, by ultrasonic measurement on a vicinity of a frame of the laminate, from the other surface of the window after forming the laminate.

In an embodiment, the acquiring the data via ultrasonic measurement includes acquisition of data about a filling condition of the adhesive member and data about a position of the groove.

According to an embodiment of the present invention, there is provided a method for fabricating a display device, the method including: preparing a display panel and a window including a base substrate and a light-shielding pattern layer, the base substrate including a first region on the display panel and overlapping the display panel, a second region extending and protruding outward from the display panel, the light-shielding pattern layer being on the first region and the second region of the base substrate; preparing a laminate including an adhesive member between the display panel and the window; and forming a groove aligned with an outer surface of the display panel, in the light-shielding pattern layer.

In an embodiment, the window has one surface facing the display panel, and an other surface opposite to the one surface, and the method further includes acquiring data, by ultrasonic measurement on a vicinity of a frame of the laminate, from the other surface of the window after forming the laminate.

According to the embodiments of the present invention, it is possible to easily analyze the filling degree of the adhesive member of the display device. Therefore, the reliability of the display device and the process efficiency may be improved, and the process cost may be reduced.

The effects of the present invention are not limited by the contents exemplified above, and various effects are further included in this specification.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Aspects and features of the present invention and methods for achieving the same will become apparent with reference to the embodiments described in detail below in conjunction with the accompanying drawings. However, the present invention is not limited to the embodiments disclosed below, but may be embodied in various suitable forms. The present embodiments merely make the disclosure of the present invention complete and are provided to fully inform the category of the invention to a person having ordinary knowledge in the technical field to which the present invention pertains, and the present invention is defined by the scope of the claims, and their equivalents.

Hereinafter, embodiments of the present invention will be described with reference to the accompanying drawings.

Figure 1:
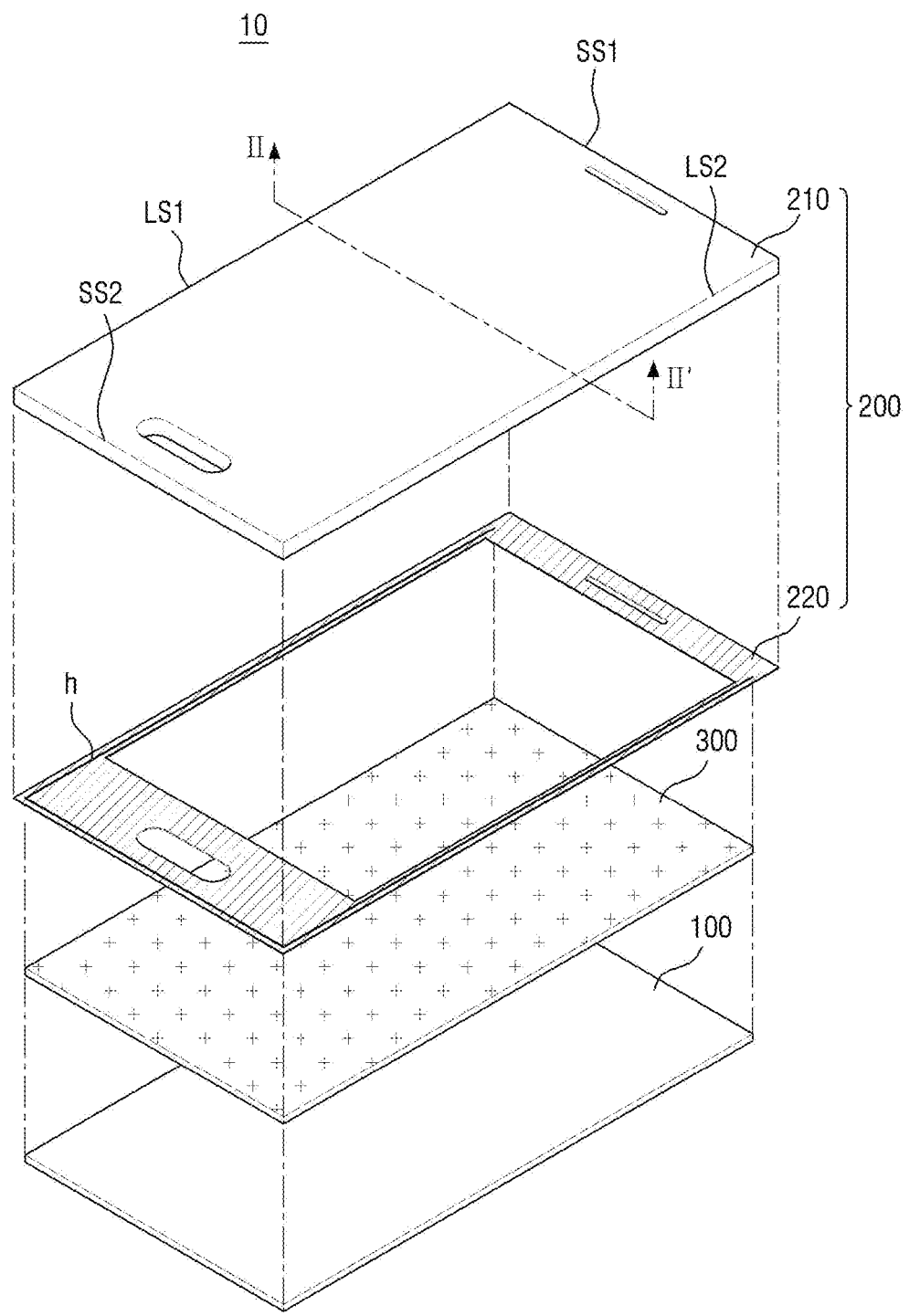
FIG. 1 is an exploded perspective view of a display device according to an embodiment of the present invention.
Figure 2:
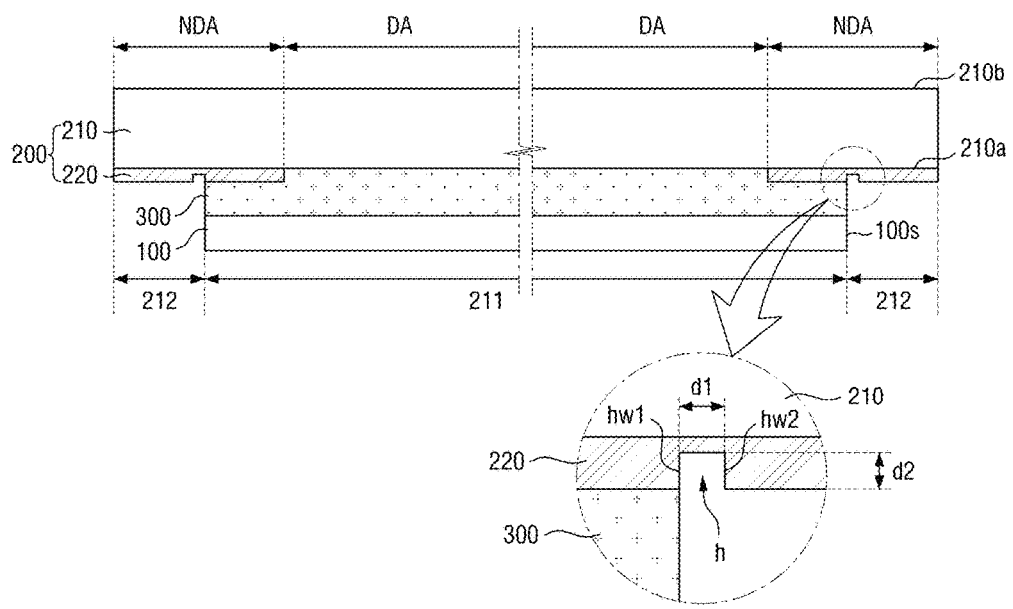
FIG. 2 is a cross-sectional view taken along the line II-II' of FIG. 1.

FIG. 1 is an exploded perspective view of a display device according to an embodiment of the present invention. FIG. 2 is a cross-sectional view taken along the line II-II' of FIG. 1.

Referring to FIGS. 1 and 2, the display device 10 is divided into a display area DA and a non-display area NDA on a plane. The display area DA is an area on which an image is displayed, and the non-display area NDA is an area on which the image is not displayed. The non-display area NDA is disposed around the display area DA. For example, when the display area DA is formed in a rectangular shape, the non-display area NDA may be disposed along the four sides of the display area.

The display device 10 has a display panel 100, a window 200 disposed on the display panel 100 to overlap the display panel 100, and an adhesive member 300 that is interposed between the display panel 100 and the window 200 to couple them.

The display panel 100 is a panel for displaying a screen, and, for example, an organic light-emitting display panel, a liquid crystal display panel, or the like may be applied. In this embodiment, a case where an organic light-emitting display panel is applied as the display panel 100 will be described as an example. The display panel 100 will be described in more detail with reference to FIG. 3.

Figure 3:
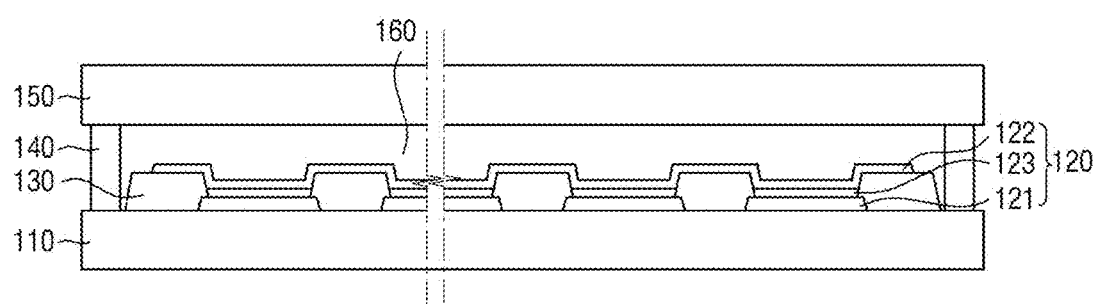
FIG. 3 is a cross-sectional view of the display panel of FIG. 1.

FIG. 3 is a cross-sectional view of the display panel of FIG. 1.

Referring to FIG. 3, the display panel 100 includes a first substrate 110, a plurality of organic light-emitting elements 120 disposed on the first substrate 110, and a second substrate 150 disposed to be spaced apart from the first substrate 110 to cover and protect the organic light-emitting element 120.

The first substrate 110 supports the organic light-emitting device 120. The first substrate 110 may be an insulating substrate. When the display panel 100 is a back or dual emission type, a transparent substrate is used as the first substrate 110. When the display panel 100 is a front emission type, a translucent or opaque substrate as well as a transparent substrate may also be applied as the first substrate 110. In this embodiment, a case of front emission is exemplified.

A plurality of organic light-emitting elements 120 is disposed on the first substrate 110. Each organic light-emitting element 120 may be provided for each pixel defined by the partition wall 130; however, the present invention is not limited thereto.

The organic light-emitting device 120 includes a first electrode 121 and a second electrode 122 that face each other, and an organic layer 123 disposed therebetween. The first electrode 121 is a pixel electrode provided for each pixel, and may be driven by a thin film transistor. The second electrode 122 may be a common electrode integrally formed across at least some of the pixels.

The first electrode 121 may be an anode electrode made of a metal having a high work function, and the second electrode 122 may be a cathode electrode made of a metal having a low work function.

The first electrode 121 and the second electrode 122 may be formed by any one of a transmissive electrode, a transflective electrode, and a reflective electrode. When the display panel 100 is a front emission type, the first electrode 121 may include a reflective electrode, and the second electrode 122 may include a transmissive electrode.

The organic layer 123 is disposed between the first electrode 121 and the second electrode 122. The organic layer 123 includes an organic light-emitting layer. The organic light-emitting layer may include a red organic light-emitting layer disposed in the red pixel, a green organic light-emitting layer disposed in the green pixel, and a blue organic light-emitting layer disposed in the blue pixel. As another example, the organic light-emitting layer may emit white light by stacking two or more organic light-emitting layers.

The organic layer 123 may further include at least one of a hole injection layer, a hole transport layer, an electron transport layer, and an electron injection layer. For example, the hole injection layer and the hole transport layer are disposed between the first electrode 121 and the organic light-emitting layer, and the electron transport layer and electron injection layer may be disposed between the organic light-emitting layer and the second electrode 122.

The display panel 100 may further include a partition wall 130 disposed on the first substrate 110. The partition wall 130 is disposed along the boundary of the pixels to partition each pixel. The partition wall 130 is located on the first electrode 121 and may be provided with an opening portion through which a part of the first electrode 121 is exposed. The organic light-emitting layer may be disposed in an opening portion defined by the partition wall 130.

A second substrate 150 is disposed on the organic light-emitting element 120 to face the first substrate 110. The second substrate 150 covers and protects the organic light-emitting element 120 or the like formed on the first substrate 110 so as to be sealed from the outside.

The second substrate 150 may be formed of a transparent insulating material, such as glass, a transparent plastic material, and/or the like.

The second substrate 150 may be disposed to be spaced apart from the first substrate 110. Here, the expression "the second substrate 150 is spaced apart from the first substrate 110" means that the second substrate 150 and the first substrate 110 themselves are spaced apart from each other, and the second substrate 150 is spaced apart from the organic light-emitting element 120 disposed on the first substrate 110. Therefore, a separation space 160 is defined between the first substrate 110 and the second substrate 150. The separation space 160 may be in a vacuum state or may be filled with gas, air, or other suitable filling material.

The first substrate 110 and the second substrate 150 are joined together by a sealing portion 140. The sealing portion 140 is located between the first substrate 110 and the second substrate 150, and may be continuously disposed along the non-display area NDA to surround the display area DA. The space of the display area DA between the first substrate 110 and the second substrate 150 surrounded by the sealing portion 140 is sealed.

In the present embodiment, the case where the second substrate 150 and the sealing portion 140 are applied as a structure for sealing the organic light-emitting element 120 is exemplified; however, the present invention is not limited thereto. A thin film sealing layer may be used in place of the second substrate 150 to seal the organic light-emitting element 120.

Referring again to FIGS. 1 and 2, the window 200 is disposed on the top of the display panel 100 to overlap the display panel 100. The window 200 includes a base substrate 210, and a light-shielding pattern layer 220 disposed on the base substrate 210.

The base substrate 210 protects the display panel 100 from external impact. The base substrate 210 may be made of a transparent material such as glass, resin, and/or the like.

The base substrate 210 is disposed to face the display panel 100 in parallel.

The base substrate 210 may have a shape corresponding to the shape of the display panel 100. For example, the base substrate 210 may have a rectangular shape on a plane. That is, the base substrate 210 may include a first long side LS1 and a second long side LS2 facing each other, and a first short side SS1 and a second short side SS2 facing each other.

The size of the base substrate 210 may be larger than that of the display panel 100. In one embodiment, all sides LS1, LS2, SS1, and SS2 of the base substrate 210 may be larger than the sides of the corresponding display panel 100.

The base substrate 210 may be disposed to cover the entire display panel 100. The first long side LS1 and the second long side LS2 of the base substrate 210 may protrude outward from the long side outer surface (see '100s' of FIG. 2) of the corresponding display panel. Furthermore, the first short side SS 1 and the second short side SS 2 of the base substrate 210 may also protrude outward from the short side outer surface of the corresponding display panel 100.

Openings (e.g., holes) corresponding to the button area, the camera area, and the like, disposed in the non-display area may be additionally formed on the base substrate 210.

The base substrate 210 includes one surface 210a facing the display panel 100, and the other surface 210b, which is an opposite surface thereof. The light-shielding pattern layer 220 may be disposed on one surface 210a of the base substrate 210. However, the present invention is not limited thereto, and the light-shielding pattern layer 220 may be disposed on the other surface 210b of the base substrate 210.

The light-shielding pattern layer 220 is disposed on at least a part of the non-display area NDA of the base substrate 210. The light-shielding pattern layer 220 is not disposed in the display area DA of the base substrate 210. In the light-shielding pattern layer 220, an opening (e.g., a hole) corresponding to a button region, a camera region, or the like disposed in the non-display area may be additionally formed.

In an embodiment, the light-shielding pattern layer 220 may be disposed along the non-display area NDA. The light-shielding pattern layer 220 may be disposed to cover the entire protruding area 212 protruding outward from the outer surface 100s of the display panel 100 in the base substrate 210. Further, the light-shielding pattern layer 220 may be disposed to not only cover a portion of the base substrate 210 overlapping the outer surface 100s of the display panel 100, and but also cover an area on the inner side thereof in which the base substrate 210 and the display panel 100 overlap each other. That is, the light-shielding pattern layer 220 may be disposed over the protruding area 212 and the overlapping area 211 of the base substrate 210 on the basis of the display panel 100. The width of the light-shielding pattern layer 220 may be equal to or greater than the width of the base substrate 210 protruding from the outer surface of the display panel 100, and may be less than or equal to the width of the non-display area NDA.

In another embodiment, the base substrate 210 protrudes only to the short sides SS1 and SS2 with respect to the display panel 100, and may not protrude to the long sides LS1 and LS2. In this case, the light-shielding pattern layer 220 may not be disposed in the non-display area NDA adjacent to the long sides LS1 and LS2 of the base substrate 210.

The light-shielding pattern layer 220 prevents or substantially prevents light from being emitted to the non-display area NDA side of the display device 10, and imparts color to the bezel of the display device 10. The light-shielding pattern layer 220 may be made to contain an opaque material. For example, the light-shielding pattern layer 220 may include black, white, gray, or other coloring materials. The color of the light-shielding pattern layer 220 disposed in the non-display area NDA outside the display area DA is recognized as the frame color outside the screen by the user, and may give beauty to the user.

The light-shielding pattern layer 220 may be formed by coating color ink on the base substrate 210, or may be attached onto the base substrate 210 via an adhesive member after being formed into the film. However, the method for forming the light-shielding pattern layer 220 is not limited by the above-mentioned methods, and the light-shielding pattern layer 220 may be formed through various suitable methods known in the art.

The thickness of the light-shielding pattern layer 220 may be 5 μm to 100 μm.

The light-shielding pattern layer 220 includes a groove h that is substantially aligned with the outer surface 100s of the display panel 100. The groove h is used to measure the position of the outer surface 100s of the display panel 100. Here, the expression "the groove h is substantially aligned with the outer surface 100s of the display panel 100" includes a case where the extension surface of the outer surface 100s of the display panel 100 passes through the inside of the grove h or the sidewall of the groove h (see, e.g., FIG. 8), as well as a case where the extension surface of the outer surface 100s of the display panel 100 is adjacent to (e.g., passes adjacent to) the groove h (see, e.g., FIG. 7) to the extent that the position of the outer surface 100s of the display panel 100 may be substantially estimated.

FIG. 2 illustrates a case where one sidewall of the groove h is aligned with the outer surface 100s of the display panel 100. Here, one sidewall of the groove h aligned with the outer surface 100s of the display panel 100 is a sidewall located on the relatively inner side. The other sidewall of the groove h located on the relatively outer side is located on the outer side from (or located opposite to) the outer surface 100s of the display panel 100. Therefore, the groove h does not overlap the display panel 100 as a whole and is located on the outer side from the outside face 100s of the display panel 100.

The groove h may be disposed in a closed curve shape along the four outer surfaces 100s of the display panel 100. However, the present invention is not limited thereto, and the formation of the groove h may be omitted in a portion adjacent to a specific side of the display panel 100, if desired. FIG. 1 illustrates a case where the groove h is formed on the first long side LS1, the second short side SS2, and the second long side LS2 except the first short side SS1.

The groove h may be continuously formed. That is, the groove h may be formed in a linear shape extending in a direction on a plane. However, the present invention is not limited thereto, and the groove h may be discontinuous and, for example, formed in a dotted line shape on a plane.

The cross-sectional shape of the groove h may be, but is not limited to be, uniform along the extended straight line.

The width d1 of the groove h may be 1 μm to 100 μm, more preferably, 50 μm to 100 μm. If the width d1 of the groove h is 1 μm or more, the position of the groove h at the time of ultrasonic analysis may be grasped, and the overflow distance of the adhesive member 300 may be reduced. If the width d1 of the groove h is 50 μm or more, the position of the groove h at the time of ultrasonic analysis may be more easily grasped, which is more effective in prevention or reduction of the overflow of the adhesive member 300. If the width d1 of the groove h is too large, the groove may be visually recognized from the outside, and also the area of the outer region of the groove h is reduced. The outer area of the groove h is utilized as a part in which the window 200 and an impact resistant module part or a set part are coupled; however, if the area is too small, it may be difficult to secure the coupling force. From the aforementioned viewpoint, the width d1 of the groove h may be 100 μm.

The cross-sectional shape of the groove h may be a square shape in which each corner is 90° along the extended line. The base surface of the groove h is flat and may be parallel to the display panel 100.

The depth d2 of the groove h indicates the distance from the surface (or the extension surface) of the light-shielding pattern layer 220 to the deepest part of the groove h in the vertical direction. When the bottom surface of the groove h is flat, the depth d of the groove h may be measured as the distance from the surface of the light-shielding pattern layer 220 to the base point of the one sidewall.

The depth d2 of the groove h is 0.1 μm or more, which may be less than the thickness of the light-shielding pattern layer 220, and more preferably, may be in the range of 20% to 60% of the thickness of the light-shielding pattern layer 220. For example, when the thickness of the light-shielding pattern layer 220 is 25 μm, the depth d2 of the groove h may be 5 μm to 15 μm. When the depth d2 of the groove h is 0.1 μm or more, the position of the groove h at the time of ultrasonic analysis may be grasped, and the overflow distance of the adhesive member 300 may be reduced. Having the depth d2 of the groove h is 20% or more of the thickness of the light-shielding pattern layer 220, may make it easier to grasp the position of the groove h at the time of ultrasonic analysis and prevent or reduce the overflow of the adhesive member. When the depth d2 of the groove h is less than the thickness of the light-shielding pattern layer 220, it is possible to prevent or reduce light leakage due to the exposure of the base substrate 210. When the depth d2 of the groove h is 60% or less of the thickness of the light-shielding pattern layer 220, this case is more effective in preventing or reducing the light leakage phenomenon of the display device 10.

In an exemplary embodiment, the thickness of the light-shielding pattern layer 220 is about 25 μm, the depth d of the groove h is about 5 μm, and the width d1 of the groove h may be about 100 μm.

The shape and arrangement of the groove h formed in the light-shielding pattern layer 220 are not limited to the above examples and may be variously modified in any suitable manner. For further explanation, reference is made to FIGS. 4 to 8.

FIGS. 4 to 8 are cross-sectional views of a display device illustrating the shape and arrangement of a groove according to various embodiments of the present invention.

Figure 4:
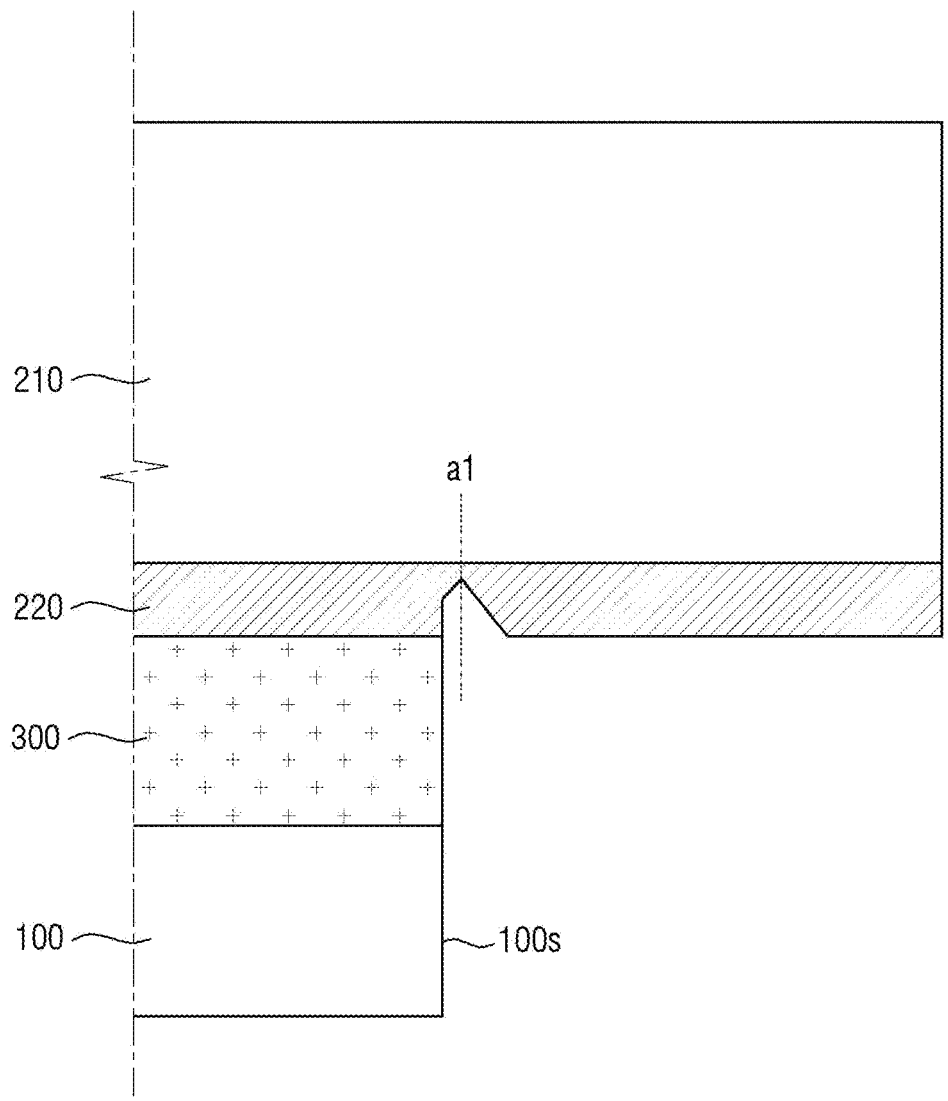
FIGS. 4-8 are cross-sectional views of a display device illustrating the shape and arrangement of a groove according to various embodiments of the present invention.

The embodiment of FIG. 4 illustrates a case where the cross section of the groove h may be trapezoidal in shape along the extended line. The respective surfaces forming the groove h are not parallel to each other, and the base surface of the groove h is not parallel to the display panel 100. A virtual straight line a1 extending parallel to the outer surface 100s of the display panel 100 at the lowest point of the groove h is located to be adjacent to the outer surface 100s of the display panel 100.

Figure 5:
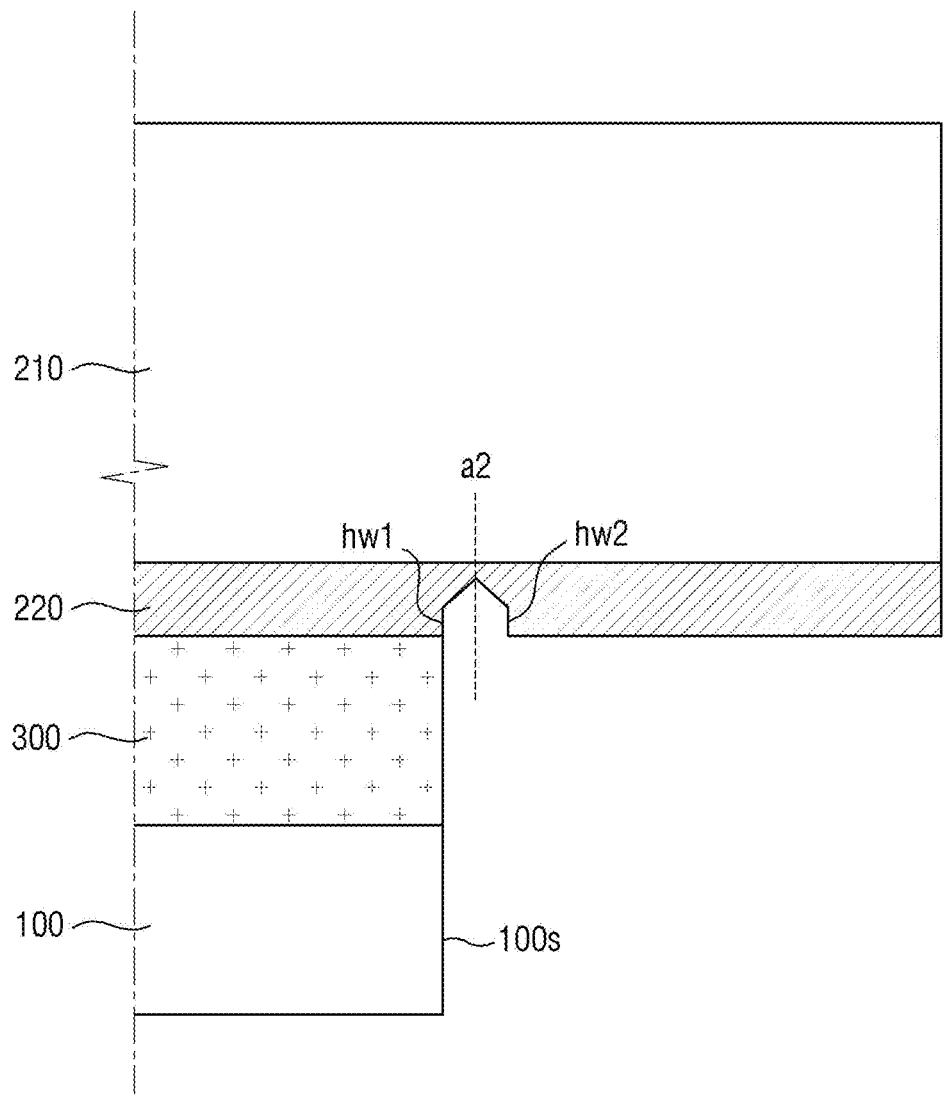

The embodiment of FIG. 5 illustrates that the cross section of the groove h may be pentagonal. The groove h may include two surfaces hw1 and hw2 parallel to the outer surface 100s of the display panel 100, and two inclined surfaces advancing from each of them toward the base point. A virtual straight line a2 extending parallel to the outer surface 100s of the display panel 100 at the lowest point of the groove h passes through the center of the groove h.

Figure 6:
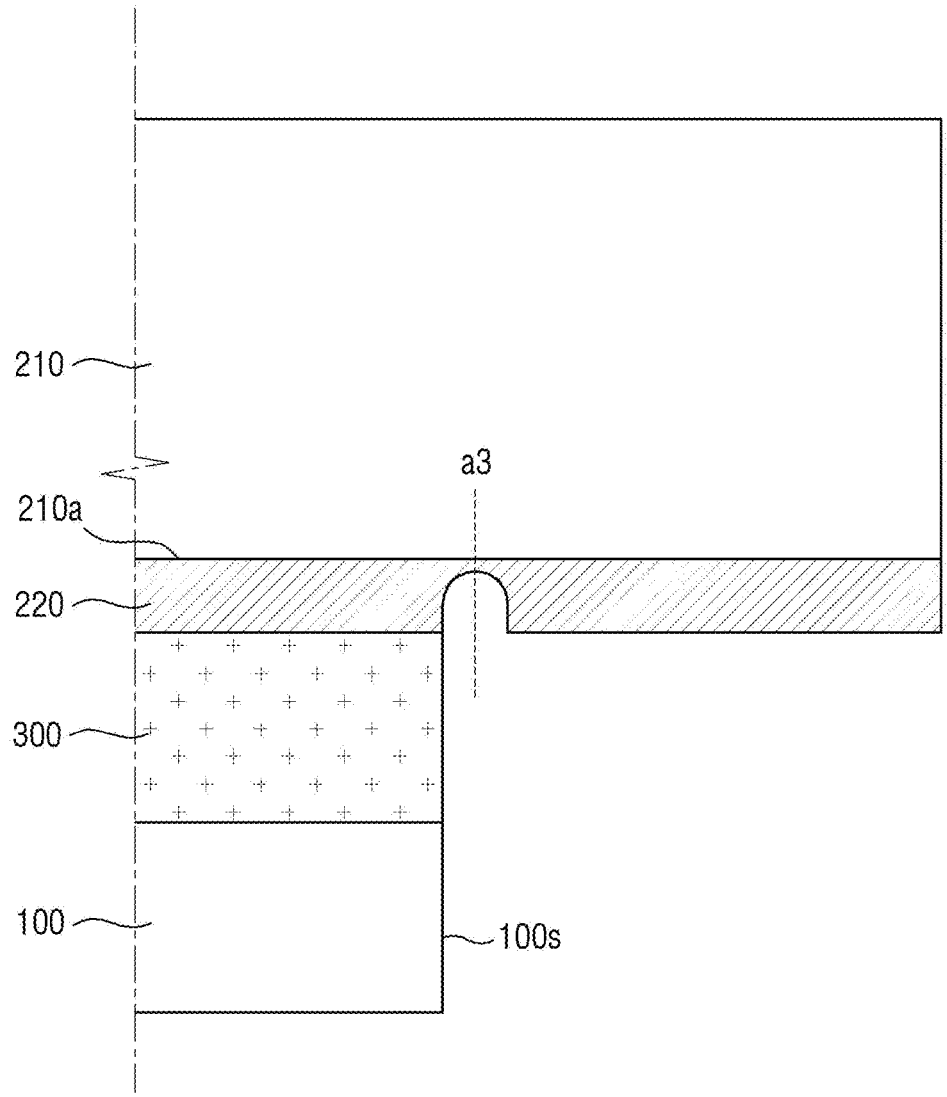

The embodiment of FIG. 6 illustrates a case where the cross section of the groove h may have a shape including a curve. The cross section of the groove h may be a form in which a semicircle is coupled to a rectangle. Here, the semicircle is coupled to the side that is the closest to the one surface 210a of the base substrate 210, among the four sides of the rectangle. A virtual straight line a3 extending parallel to the outer surface 100s of the display panel 100 at the lowest point of the groove h passes through the center of the groove h.

Figure 7:
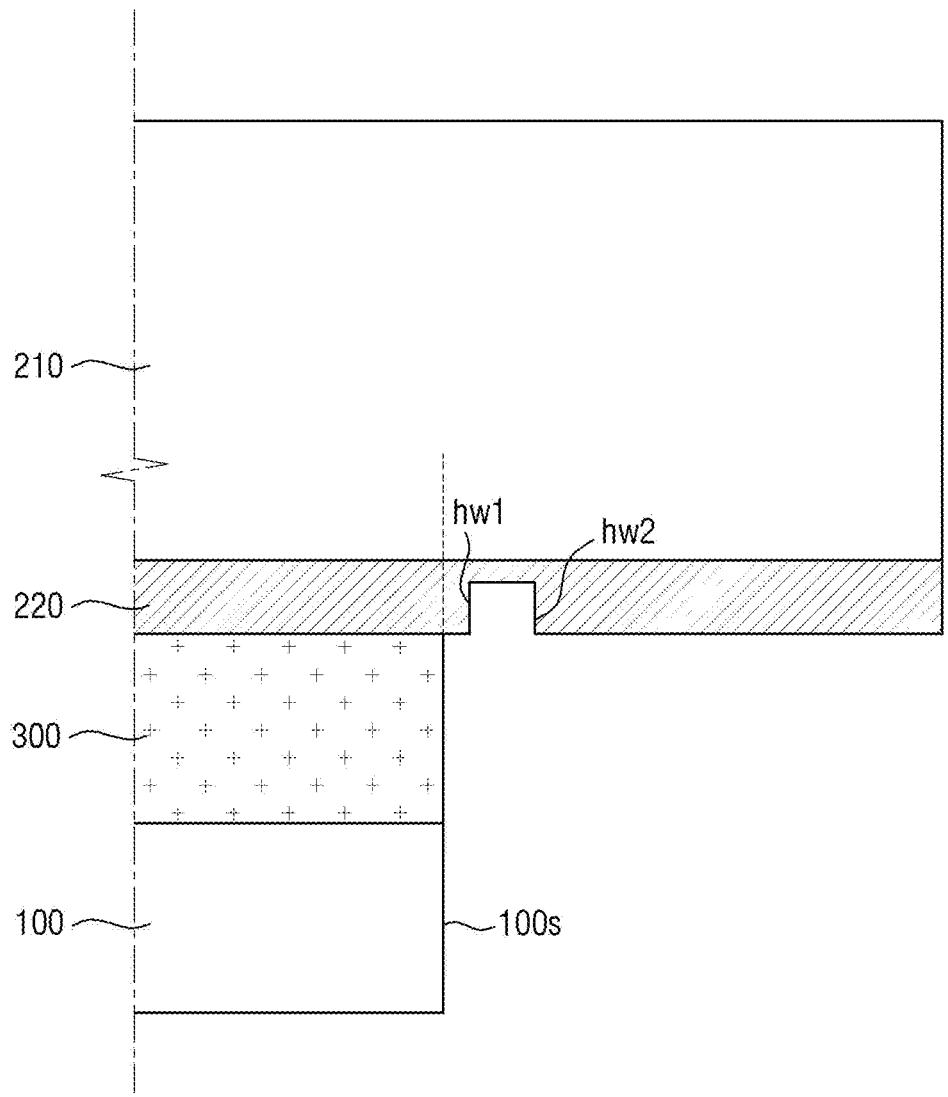

The embodiment of FIG. 7 illustrates a case where one sidewall hw1 of the groove h located on the relatively inner side is located closer to the outer side than the outer surface 100s of the display panel 100. One sidewall hw1 of the groove h may be formed to be spaced apart from the extension surface of the outer surface 100s of the display panel 100, at a constant distance, in the outward direction of the light-shielding pattern layer 220.

Figure 8:
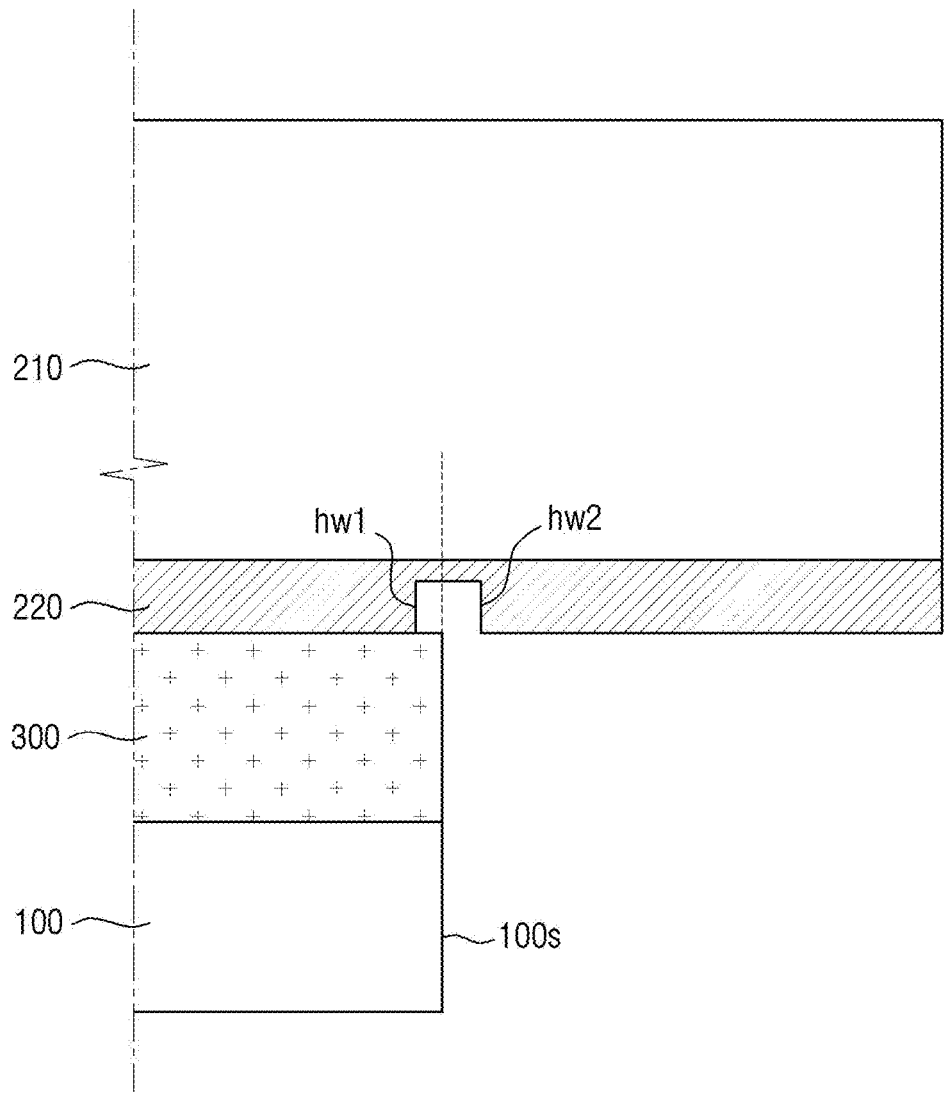

The embodiment of FIG. 8 illustrates a case where one sidewall hw1 of the groove h located on the relatively inner side is located closer to the inner side than the outer surface 100s of the display panel 100. Therefore, in the case of this embodiment, the extension surface of the outer surface 100s of the display panel 100 passes through the inside of the groove h.

Referring again to FIGS. 1 and 2, the adhesive member 300 is interposed between the display panel 100 and the window 200 to couple the display panel 100 and the window 200.

The adhesive member 300 may be formed of an optically clear resin (OCR), an optically clear adhesive film (OCA), or the like, and physical properties such as surface tension and viscosity of the adhesive member 300 change depending on the kind of the adhesive member. Therefore, the application method may be different depending on each adhesive member, and fine adjustment is required to apply an appropriate amount.

It may be desired that the adhesive member 300 be sufficiently applied so that the window and the display panel are not detached, and the extent to which the adhesive member 300 is filled between the display panel 100 and the window 200 influences on the coupling force between these members and the coupling reliability of the impact resistant module part or the set part.

The groove h formed on the light-shielding pattern layer 220 serves to reduce the overflow distance of the adhesive member 300. Thus, even if the adhesive member 300 overflows to the outside of the display panel 100, the groove h is filled, and it is possible to prevent or reduce the additional overflowing due to the surface tension in the state of filling the groove h. A portion in which the adhesive member 300 overflows is difficult to exhibit a sufficient coupling force when the impact resistant module part or the set part is coupled. When suppressing the overflow of the adhesive member 300 by the groove h as in this embodiment, because it is possible to sufficiently secure the area in which the impact resistant module part, the set part, or the like is strongly coupled to the window 200, it is possible to enhance the stability of the set coupling.

In order to experimentally check the effect of suppressing the overflow of the adhesive member 300 through the groove h formed on the light-shielding pattern layer 220, two window 200 having the light-shielding pattern layer 220 with the thickness of 25 μm formed therein were prepared. One of them is a comparative example in which the groove h is not formed, and the other one is an example in which the groove h having a width of 100 μm and a depth of 5 μm was formed to be aligned with the outer surface 100s of the display panel 100. Optically clear resin (OCR) was slit coated as an adhesive member 300 on the front surface of the display panel 100 to laminate the window. As a result of measuring the overflow distance as to how the optically clear resin overflowed from the outer surface 100s of the display panel 100 after the laminate, in the comparative example having no groove h, the optically clear resin overflowed from the outer surface 100s of the display panel 100 by 0.359 mm; however, in the embodiment in which the groove h was formed, the overflow distance was only 0.179 mm. That is, the overflow distance of the example having the groove h formed thereon decreased to 50% or less as compared with the case having no groove. Therefore, it is possible to understand that the embodiment in which the groove h is formed is effective to prevent or reduce the overflow of the adhesive member 300.

The groove h formed on the light-shielding pattern layer 220 may be used to reduce the overflow distance of the adhesive member 300 and also to measure the filling degree of the adhesive member 300. Although the filling degree of the adhesive member 300 may be checked by cutting the cross section after completing the display device, using this method it may be difficult to check the filling degree of portions other than the site appearing in the cross section, and it may not be desirable in terms of reliability, process efficiency and cost, due to, for example, a long inspection time, and the discarding of the products after the inspection. When the groove h is formed on the light-shielding pattern layer 220, because the filling degree of the adhesive member 300 may be effectively measured by non-destructive inspection, reliability, process efficiency and process costs may be improved.

Hereinafter, with reference to FIGS. 9 to 17, a method for fabricating a display device in which the groove h is formed in the light-shielding pattern layer 220 according to one embodiment will be described.

Figure 9:
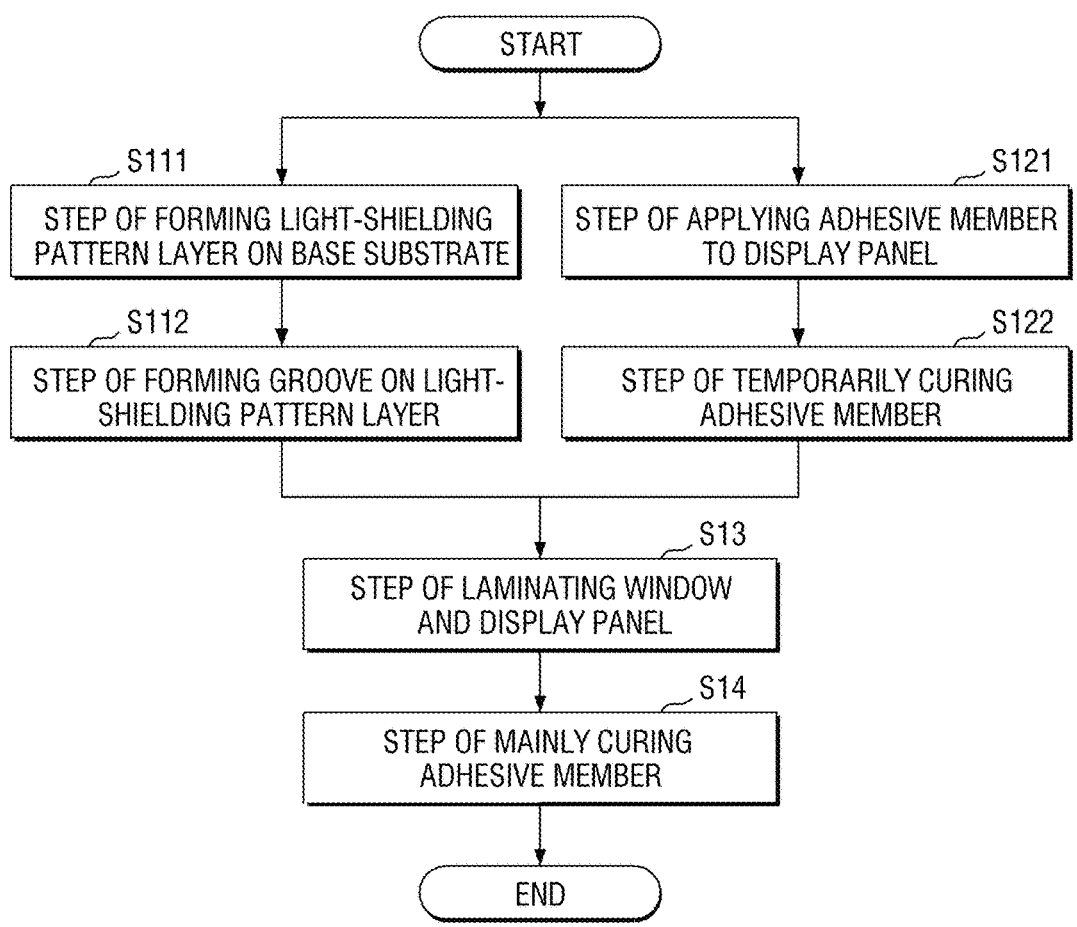
FIG. 9 is a flow diagram of a method for fabricating a display device according to an embodiment of the present invention.

FIG. 9 is a flow diagram of a method for fabricating a display device according to an embodiment of the present invention. FIGS. 10 to 17 are cross-sectional views illustrating the process steps of the method for fabricating the display device according to an embodiment of the present invention.

Figure 10:
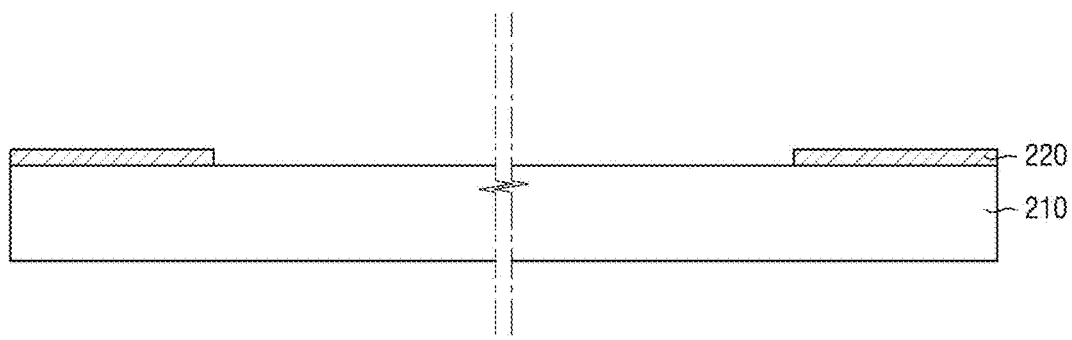
FIGS. 10-17 are cross-sectional views illustrating the process steps of a method for fabricating a display device according to an embodiment of the present invention.

Referring to FIGS. 9 and 10, the light-shielding pattern layer 220 is formed on the base substrate 210 (S111). The light-shielding pattern layer 220 may be formed by a method of coating color ink along the frame of one surface of the base substrate 210.

Figure 11:
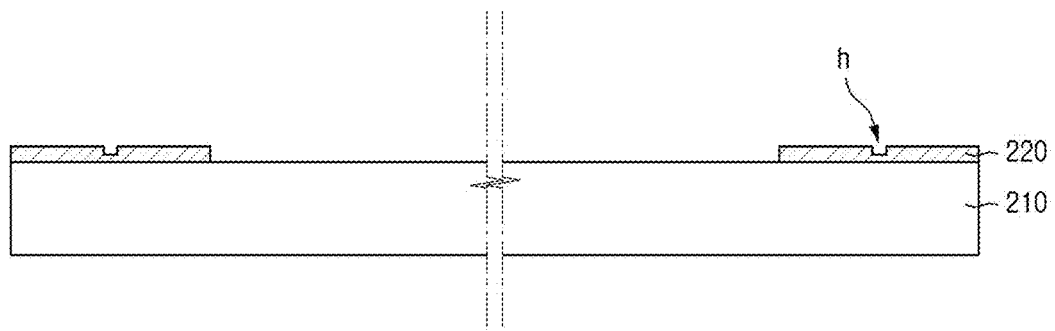
Figure 12:
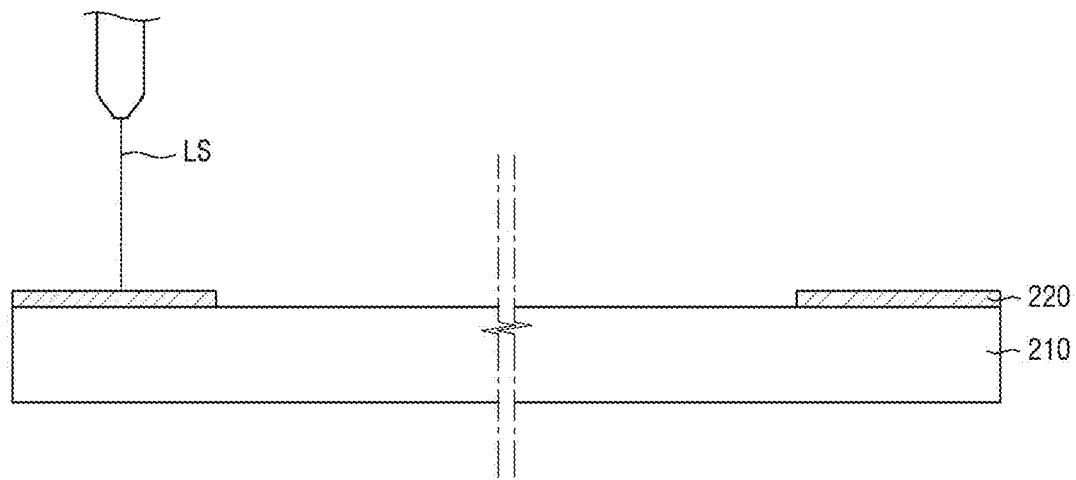
Figure 13:
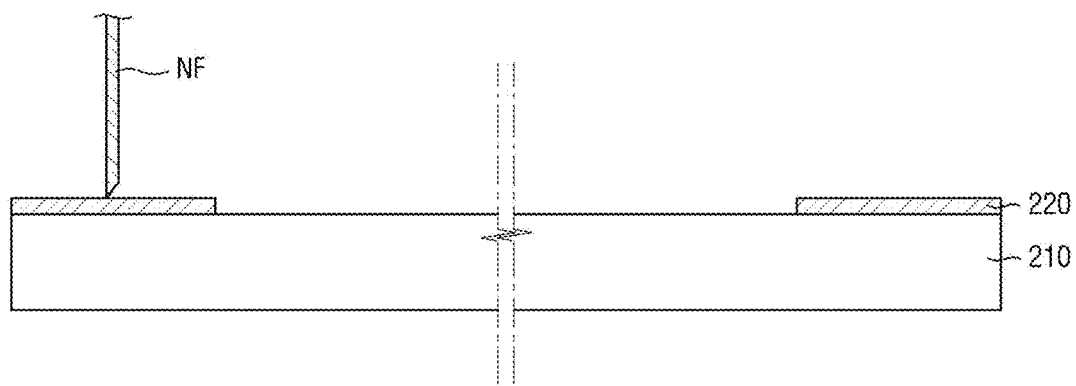

Subsequently, as illustrated in FIGS. 11 to 13, a groove his formed in the light-shielding pattern layer 220 (S112). As illustrated in FIG. 12, the groove h may be formed by irradiating a laser LS onto the light-shielding pattern layer 220. Lasers LS may be irradiated along predefined positions.

The irradiation position of the laser LS may be determined in advance at a position where the outer surface 100s of the display panel 100 is substantially aligned as a result of the subsequent laminate process of the window 200 and the display panel 100. The width or the depth of the groove h may be adjusted by the wavelength, energy, irradiation time, irradiation angle, and/or the like of the laser LS to be irradiated. The shape and arrangement of the groove h formed by the laser LS may be a shape including rectangular cross section as in the embodiment of FIGS. 2, 7 and 8, or a shape including the curved cross section as in the embodiment of FIG. 6; however, the shape is not limited to thereto.

As another example, the groove h may be formed by a method of making a scratch using a knife NF, a cone or other sharply pointed tool on the light-shielding pattern layer 220, as illustrated in FIG. 13. The width and depth of the groove h may vary, depending on the shape of the knife NF or the like, and the degree of pressurization. The shapes and arrangements of the grooves h formed by the knife NF may be, but are not limited to be, the embodiments and the like of FIGS. 2, 5, 7, and 8.

Figure 14:
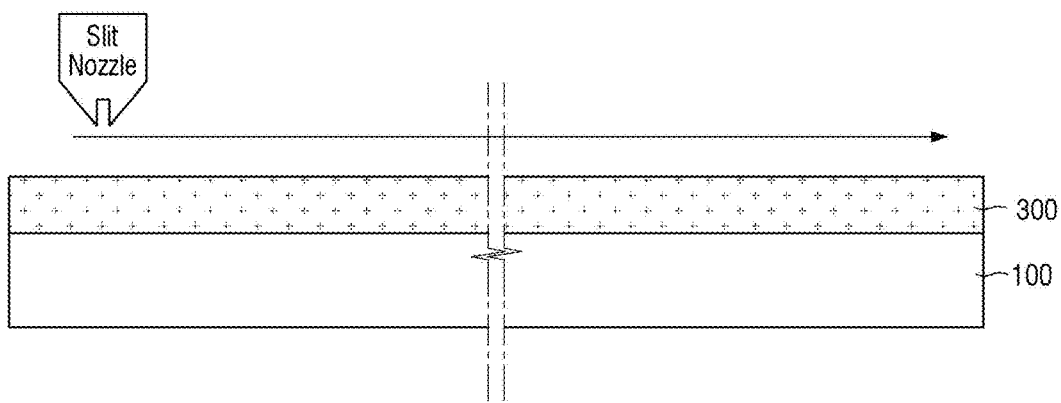
Figure 15:
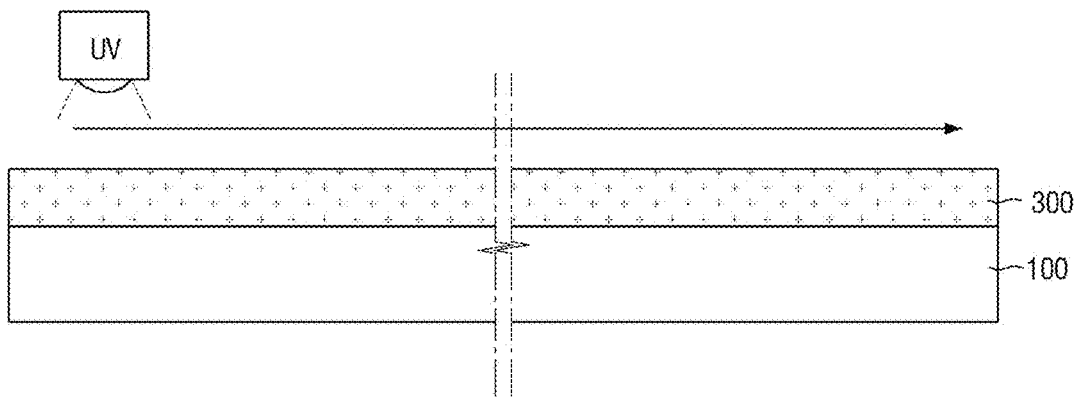

Referring to FIGS. 14 and 15, the adhesive member 300 is applied to one surface of the display panel 100 (S121). For example, an optically clear resin is applied to one surface of the display panel 100, using a slit nozzle. Subsequently, ultraviolet irradiation and/or heat is applied to temporarily cure the optically clear resin (S122).

Figure 16:
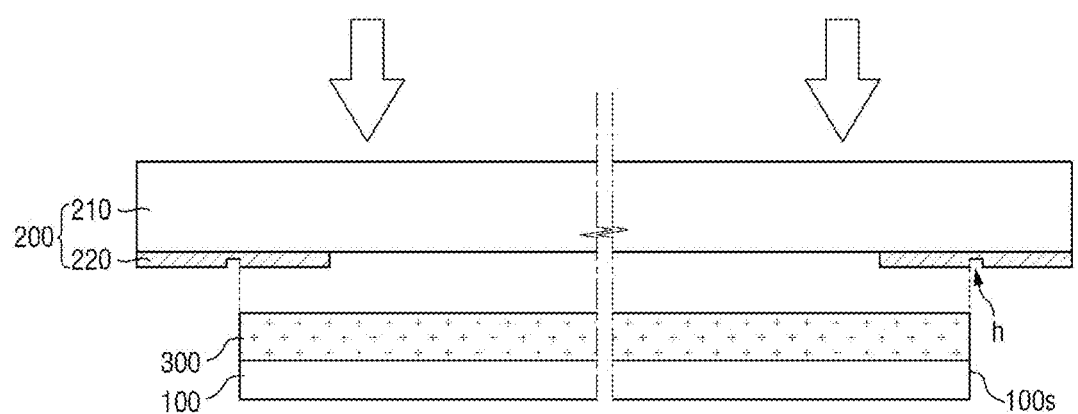

Subsequently, as illustrated in FIG. 16, the display panel 100 and the window 200 are laminated (S13). For example, the display panel 100 is disposed so that the surface of the adhesive member 300 faces upward, and the window 200 is adsorbed by a vacuum pump and disposed on top of the display panel 100. Thereafter, the window is lowered to come into contact with the surface of the adhesive member 300 on the display panel 100. Next, the alignment state between the display panel 100 and the window 200 is adjusted. Adjustment is performed so that the outer surface 100s of the display panel 100 and the groove h are aligned at the time of alignment. The window 200 protrudes outward from the display panel 100, and the outer surface 100s of the display panel 100 may be located in the region in which the light-shielding pattern layer 220 of the window 200 is formed.

Figure 17:
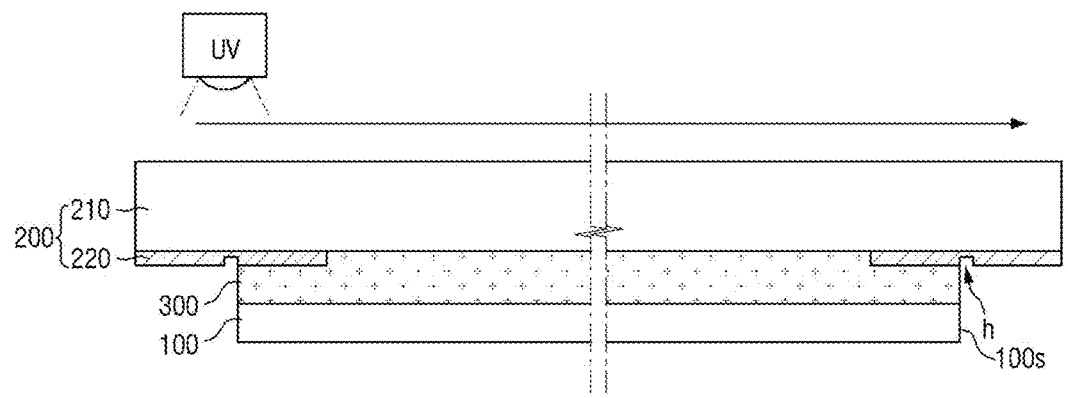

Subsequently, after performing the autoclave process, as illustrated in FIG. 17, ultraviolet irradiation and/or heat is applied to mainly cure the optically clear resin (S14). As a result, a laminate of the display panel 100/the window 200 in which the groove h is formed on the light-shielding pattern layer 220 is completed.

Hereinafter, a method for fabricating a display device according to another embodiment of the present invention will be described.

Figure 18:
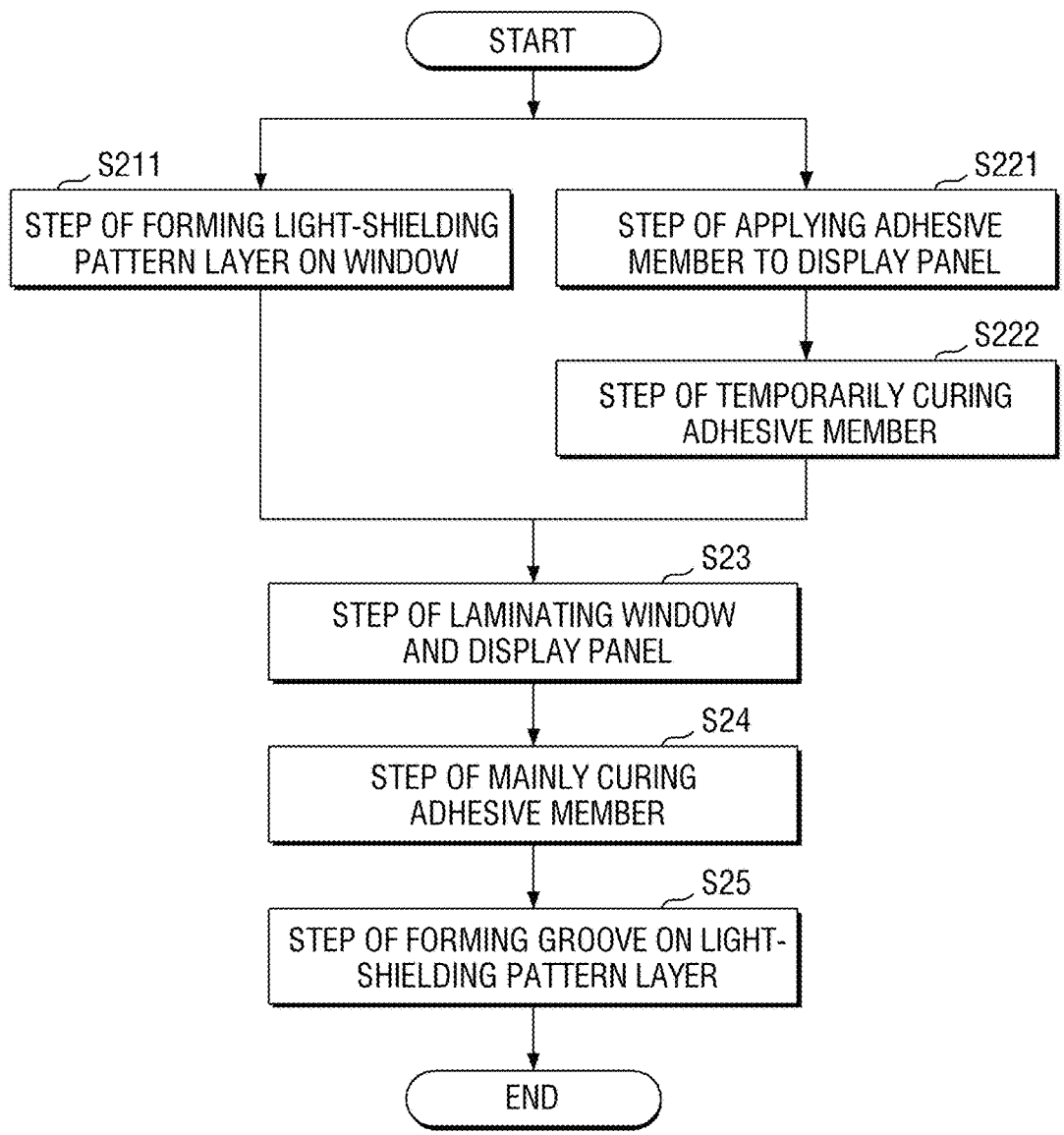
FIG. 18 is a flow diagram of a method for fabricating a display device according to another embodiment of the present invention.

FIG. 18 is a flow diagram of a method for fabricating a display device according to another embodiment of the present invention. FIGS. 19 to 26 are cross-sectional views illustrating process steps of a method for fabricating a display device according to another embodiment of the present invention. The method for fabricating the display device according to the present embodiment differs from the method for fabricating the display device illustrated in FIGS. 9 to 17 in that the groove h is formed on the light-shielding pattern layer 220 after laminating the display panel 100 and the window 200.

Figure 19:
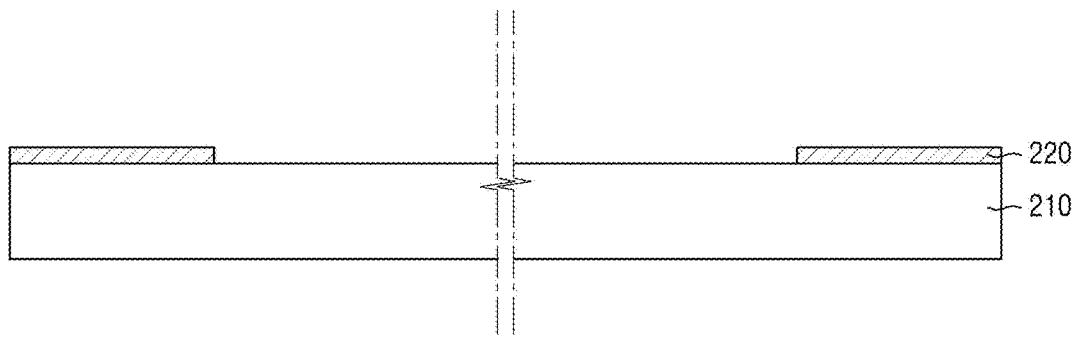
FIGS. 19-26 are cross-sectional views illustrating the process steps of a method for fabricating a display device according to another embodiment of the present invention.

Referring to FIGS. 18 and 19, a light-shielding pattern layer 220 is formed on the base substrate 210 (S211). The light-shielding pattern layer 220 may be formed by a method of coating color ink along the frame of one surface of the base substrate 210.

Figure 20:
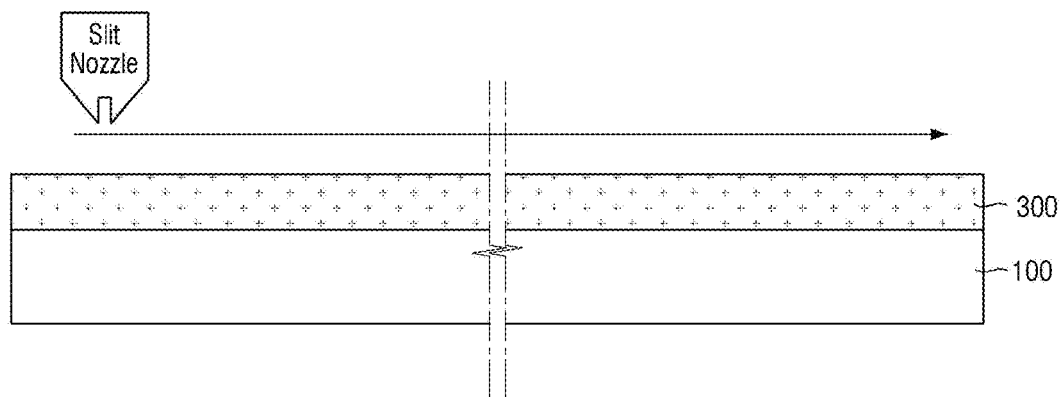

Referring to FIGS. 18 and 20, the adhesive member 300 is applied to one surface of the display panel 100 (S221). For example, an optically clear resin is applied to one surface of the display panel 100, using a slit nozzle.

Figure 21:
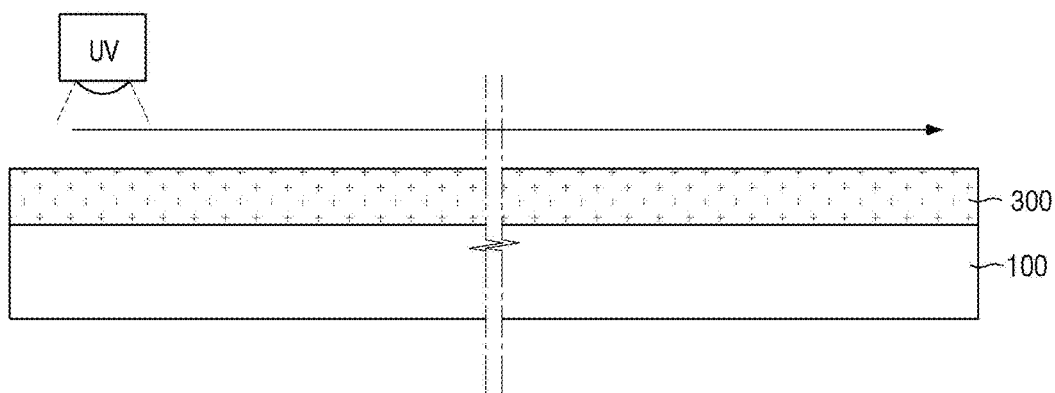

Subsequently, referring to FIGS. 18 and 21, the optically clear resin is temporally cured by being irradiated with ultraviolet rays and/or applied with heat (S222).

Figure 22:
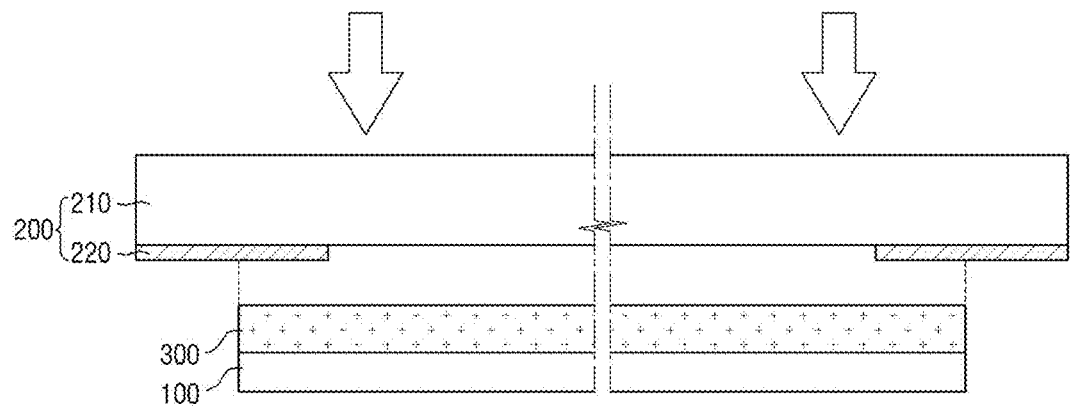

Subsequently, as illustrated in FIG. 22, the display panel 100 and the window 200 are laminated (S23). For example, the display panel 100 is disposed so that the surface of the adhesive member 300 faces upward, and the window 200 is absorbed by a vacuum pump and disposed on the top of the display panel 100. Thereafter, the window is lowered to come into contact with the surface of the adhesive member 300 on the display panel 100. Next, the alignment between the display panel 100 and the window 200 is adjusted. The window 200 protrudes outward from the display panel 100 when aligned, and the outer surface 100s of the display panel 100 may be located within the region in which the light-shielding pattern layer 220 of the window 200 is located.

Figure 23:
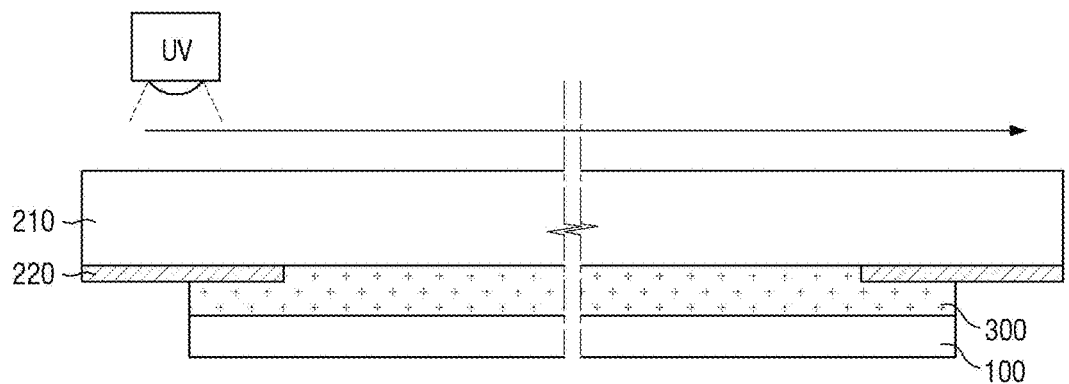

Subsequently, after performing the autoclave process, as illustrated in FIG. 23, the optically clear resin is mainly cured by ultraviolet irradiation and/or heat application.

Figure 24:
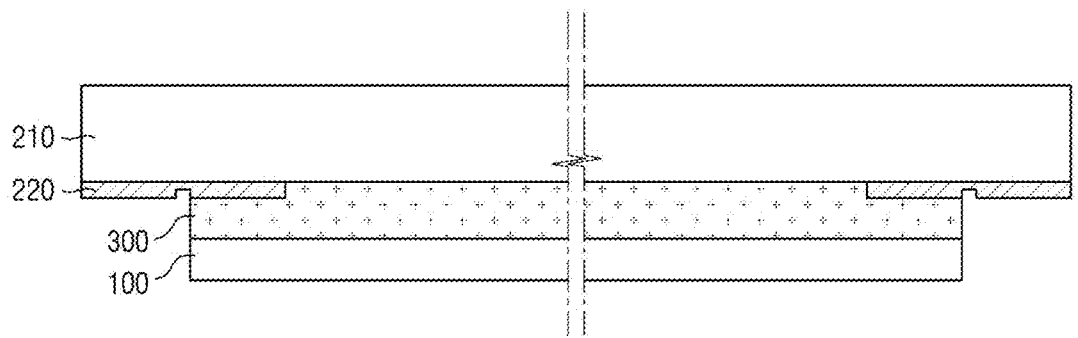
Figure 25:
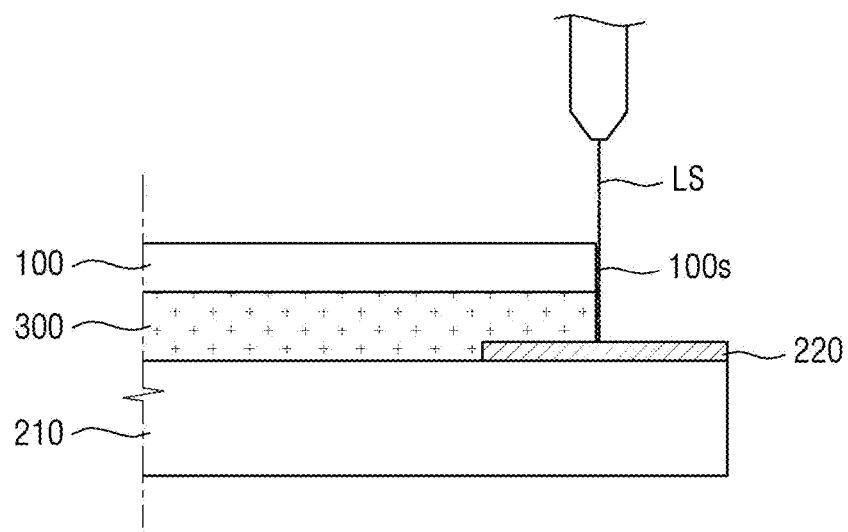
Figure 26:
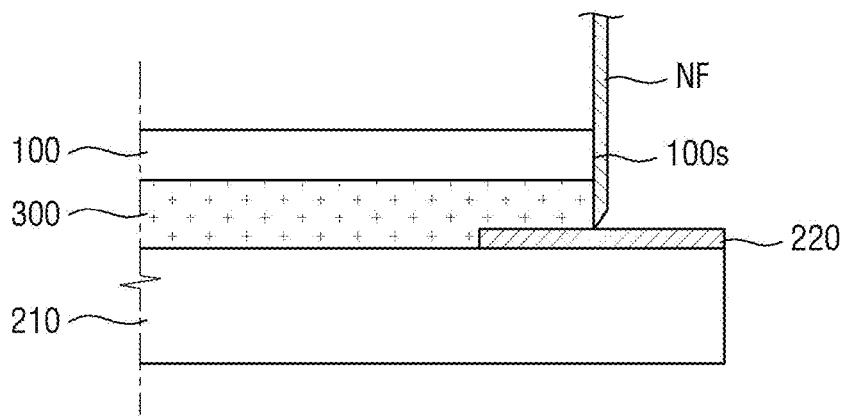

Next, referring to FIGS. 24 to 26, a groove h is formed on the light-shielding pattern layer 220 of the window 200 (S25).

The groove h of the light-shielding pattern layer 220 may be formed by irradiating a laser LS onto the light-shielding pattern layer 220 as illustrated in FIG. 25. The irradiation position of the laser LS may be adjusted to be aligned with or adjacent to the outer surface 100s of the display panel 100. The width or depth of the groove h may be adjusted by the wavelength, energy, irradiation time, irradiation angle, and/or the like of the laser LS to be irradiated. The shape and arrangement of the groove h formed by the laser LS may be a shape including a rectangular cross section as in the embodiment of FIGS. 2, 7 and 8, or a shape including a curved cross section as in the embodiment of FIG. 6; however, the invention is not limited thereto.

As another example, the groove h may be formed by a method of forming a scratch on the light-shielding pattern layer 220, using a knife NF, a cone or other sharply pointed tool as illustrated in FIG. 26. For example, the scratch may be formed by moving the knife NF or the like along the outer surface 100s of the display panel 100 in a state in which a body portion of the knife NF or the like is brought into contact with the outer surface 100s of the display panel and the cutting portion of the knife NF or the like is pressurized to partially penetrate the light-shielding pattern layer 220 in a thickness direction. The width and depth of the groove h may be suitably varied depending on the shape of the knife NF or the like and the degree of pressurization. The shape and arrangement of the groove h formed by the knife NF may be, but are not limited to be, the same or substantially the same as those in the embodiments of FIGS. 2, 5, 7, and 8.

The method for fabricating the display device may further include an inspection step. The display device fabricated by the method as described above may be effectively utilized for non-destructive inspection for checking the degree of filling of the adhesive member. Hereinafter, a non-destructive inspection method of the display device will be described with reference to FIGS. 27 to 32.

Figure 27:
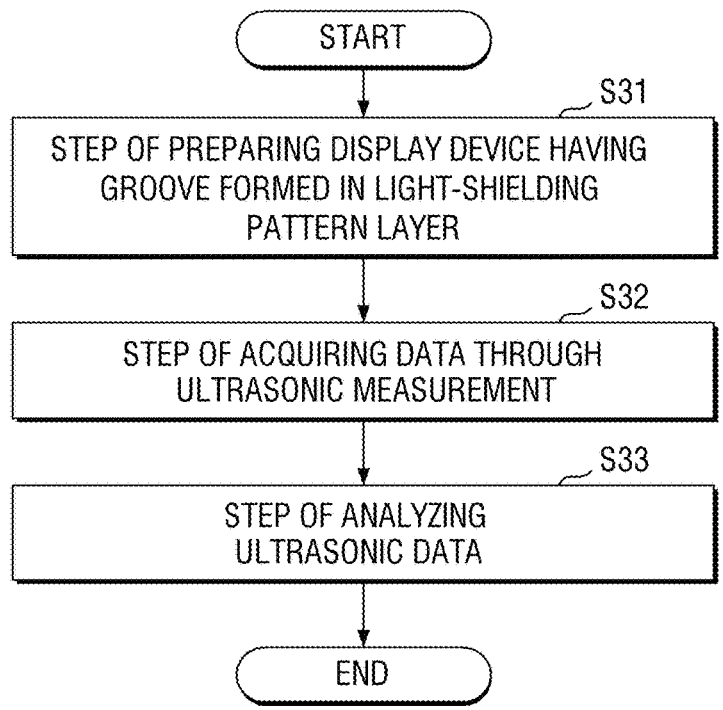
FIG. 27 is a flow diagram of a non-destructive inspection method according to an embodiment of the present invention.

FIG. 27 is a flow diagram of a non-destructive inspection method according to an embodiment of the present invention.

Figure 28:
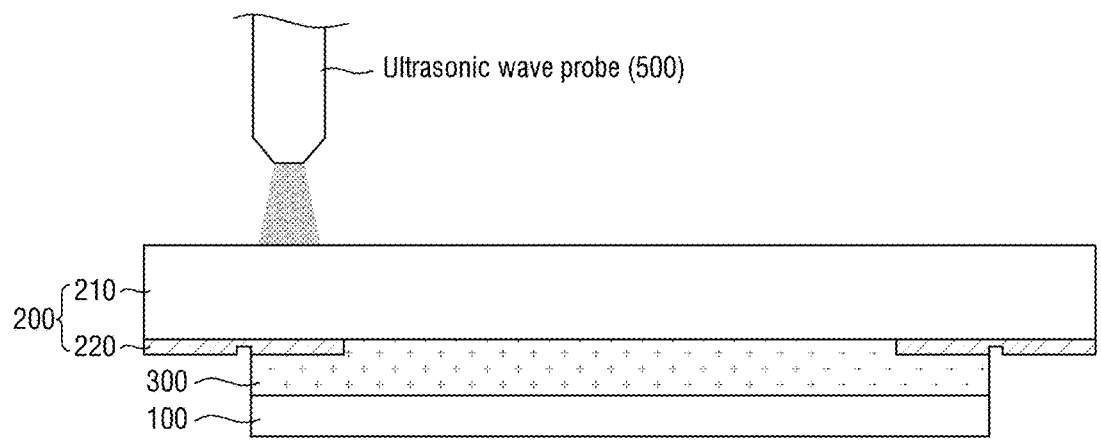
FIG. 28 is a cross-sectional view illustrating a non-destructive inspection method according to an embodiment of the present invention.

Referring to FIGS. 27 and 28, a display device 10 having the groove h formed in the light-shielding pattern layer 220 is prepared (S31).

The groove h of the light-shielding pattern layer 220 may be formed by the method according to the above-described various embodiments, as described above.

Subsequently, as illustrated in FIG. 28, in order to grasp the filling degree of the adhesive member 300, data is obtained through ultrasonic measurement (S32).

For example, a laminate of the display panel 100 and the window 200 is disposed, an ultrasonic probe 500 irradiates the ultrasonic signal to the vicinity of the frame of the laminate, and the ultrasonic probe 500 receives the input of the ultrasonic data reflected from the vicinity of the frame. The ultrasonic probe 500 may include a transducer, the pulse transmission module, and a pulse reception module. The pulse transmission module radiates the ultrasonic signal to the examination target via the transducer, and the pulse reception module receives the echo signal returning from the examination target.

Because the ultrasonic wave is mainly transmitted through liquids and solids as a medium, ultrasonic signals are not transmitted to the space filled with vacuum or gas. Therefore, when there is an empty space without liquid or solid in the advancing direction of the ultrasonic signal, it is difficult to acquire ultrasonic data on the next substance of that region.

When a separation space 160 exists between the first substrate 110 and the second substrate 150 as described above in the display panel 100 according to the embodiment, when radiating the ultrasonic signal to the display panel 100 side, it is difficult to acquire data about the adhesive member 300 on the upper side of the display panel 100. In the case of the window 200, because the adhesive member 300 is also filled with the medium without an empty space, it is suitable for radiating ultrasonic signals to collect the data.

Therefore, the ultrasonic signal is radiated to the other surface 210b side of the base board 210 of the window 200. The ultrasonic signal passes through the base substrate 210, reaches the light-shielding pattern layer 220 on the one surface 210a of the base substrate 210 and the groove h, and is reflected therefrom. The reflected ultrasound signal passes through the base substrate 210 again and may be input to the pulse reception module of the ultrasound probe 500.

In the ultrasonic measurement, a contact type flaw detection method and a non-contact flaw detection method may be used depending on the presence or absence of contact between the ultrasonic probe 500 and the base substrate 210. The non-contact flaw detection method is less influenced by the surface condition and shape of the base substrate 210, and scratch may not occur on the surface due to friction between the ultrasonic probe 500 and the surface of the base substrate 210.

The non-contact flaw detection method requires a contact medium to transmit the ultrasonic signal radiated from the ultrasonic probe 500 to the base substrate 210, and may exemplarily use, but is not limited to, water excellent in ultrasonic transmission efficiency.

The non-contact flaw detection method includes a water immersion ultrasonic flaw detection method and a water jet method. The water immersion ultrasonic flaw detection method is a method of dipping a display device in water and then performing the ultrasonic flaw detection using the ultrasonic probe 500. The water jet method is a method of performing ultrasonic flaw detection, while ejecting water onto a display device. Because the water jet method is not dipped in water, the display device 10 may be reused.

The frequency at the time of ultrasonic measurement may be 5 MHz to 500 MHz or 30 MHz to 70 MHz, but the present invention is not limited thereto. Because the wavelength becomes shorter as the frequency becomes higher, it is suitable for detecting small defects, while using the high frequency at the time of ultrasonic flaw detection. That is, the range resolution of the ultrasonic wave (which is the ability to discriminate different objects in the advancing direction of the sound velocity) is excellent within the above range.

As described above, various methods for measuring ultrasonic waves are exemplified, but the present invention is not limited thereto.

Figure 29:
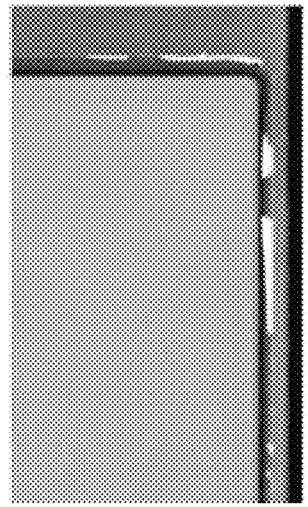
FIG. 29 is a photograph of an ultrasonic image that is output by a method according to an embodiment of the present invention.

FIG. 29 is a photograph of an ultrasonic image that is output by the method according to an embodiment of the present invention.

Referring to FIGS. 27 and 29, subsequently, the ultrasound data is analyzed (S33).

For example, the signal received by the pulse reception module is used to form an image. The filling degree of the adhesive member 300 may be grasped in addition to whether or not crack occurs inside the display device, or whether or not a plurality of configurations constituting the display device is appropriately arranged, through the ultrasonic image.

A part filled with the adhesive member 300 in the ultrasonic image of FIG. 29 is displayed in a darker color than the periphery, and a part unfilled with the adhesive member 300 is displayed somewhat brighter than the periphery, and thus, the position thereof may be checked. Further, the groove h of the light-shielding pattern layer 220 is also displayed somewhat brighter than the periphery, and its position may be checked. Because the groove h is substantially arranged on the outer surface 100s of the display panel 100, the position of the outer surface 100s of the display panel 100 may be estimated on the basis of the arrangement. Therefore, it is possible to easily check whether the adhesive member 300 overflows from the outer surface 100s of the display panel 100, or does not reach the outer surface 100s and is not filled.

Figure 30:
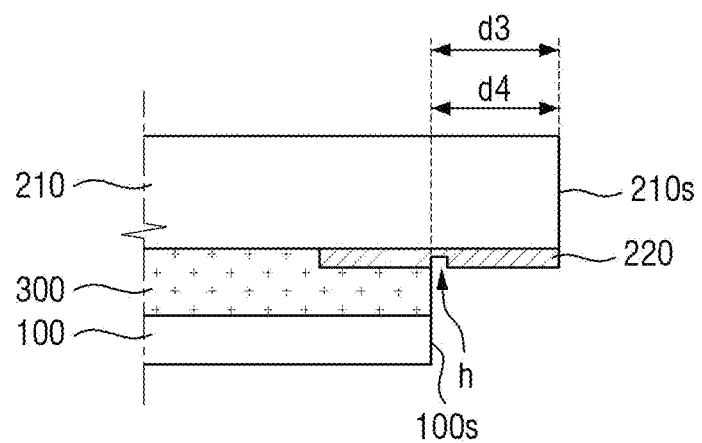
FIGS. 30-32 are cross-sectional views illustrating various filling states of the adhesive member.
Figure 31:
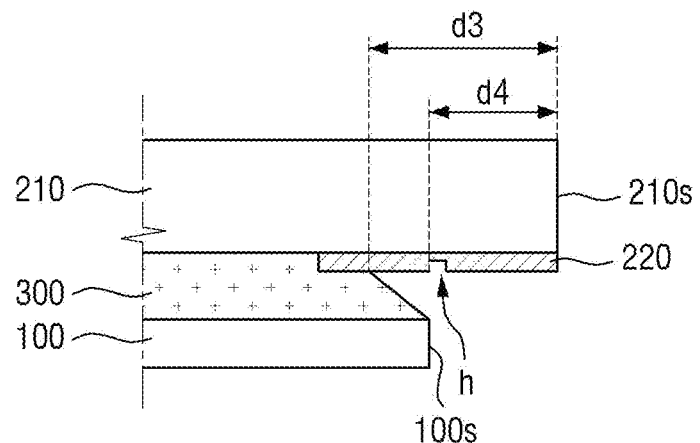
Figure 32:
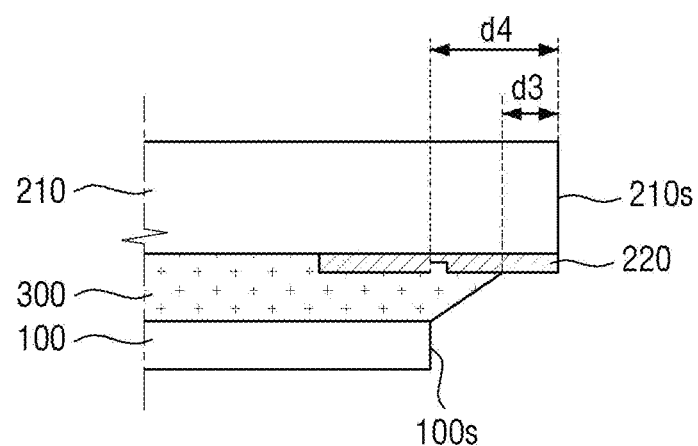

FIGS. 30 to 32 are cross-sectional views illustrating filling states of various adhesive members.

The cross-sectional view of FIG. 30 illustrates a case where the adhesive member 300 is accurately filled up to the extension surface of the outer surface 100s of the display panel 100, and illustrates a case where sufficient coupling force is imparted to the part between the display panel 100 and the window 200 and the overflow of the adhesive member 300 is also suppressed, thereby securing a sufficient area of a stable coupling part such as an impact resistance module part or a set part.

In this case, the ultrasonic image is displayed in such a manner that the tip of the portion filled with the adhesive member 300 coincides with the position of the groove h. That is, the distance d3 from the outer surface 210s of the window 200 to the adhesive member 300 is measured to be equal to the distance d4 from the outer surface 210s of the window 200 to the groove h.

The cross-sectional view of FIG. 31 illustrates a case where the adhesive member 300 is not filled up to the extension surface of the outer surface 100s of the display panel 100, and a sufficient coupling force is not given to the part between the display panel 100 and the window 200.

In this case, the ultrasonic image is displayed in such a manner that the tip of the portion filled with the adhesive member 300 is located inside the position of the groove h. That is, the distance d3 from the outer surface 210s of the window 200 to the adhesive member 300 is measured to be larger than the distance d4 from the outer surface 210s of the window 200 to the groove h.

The cross-sectional view of FIG. 32 illustrates a case where the adhesive member 300 is filled beyond the extension surface of the outer face 100s of the display panel 100, and an area of the stable coupling site such as the impact resistant module part or the set part decreases.

In this case, the ultrasonic image is displayed in such a manner that the tip of the portion filled with the adhesive member 300 is located outside the position of the groove h. That is, the distance d3 from the outer surface 210s of the window 200 to the adhesive member 300 is measured to be smaller than the distance d4 from the outer surface 210s of the window 200 to the groove h.

As described above, when analyzing the ultrasonic data, it is possible to easily grasp whether the adhesive member 300 is not filled or overfilled on the basis of the position of the groove h, even without cutting the display device.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

While the present invention has been particularly illustrated and described with reference to exemplary embodiments thereof, it will be understood by those of ordinary skill in the art that various suitable changes in form and detail may be made therein without departing from the spirit and scope of the present invention as defined by the following claims and equivalents thereof. The exemplary embodiments should be considered in a descriptive sense and not for purposes of limitation.

What is claimed is:

1. A display device comprising:
   a display panel;
   a window on the display panel; and
   an adhesive member between the display panel and the window,
   wherein the window comprises a base substrate and a light-shielding pattern layer, the base substrate comprising a first region overlapping the display panel, and a second region extending and protruding outward from the display panel, the light-shielding pattern layer being on the first region and the second region and comprising a groove adjacent to an outer edge surface of the display panel, and
   wherein the groove comprises an inner wall and an outer wall, the inner wall of the groove being aligned with the outer edge surface of the display panel.

2. The display device of claim 1, wherein the groove extends linearly along the outer edge surface of the display panel.

3. The display device of claim 2, wherein the display panel has a rectangular shape, and the groove extends along at least one side of the rectangular shape.

4. The display device of claim 1, wherein a width of the groove is 1 μm to 100 μm, and a depth of the groove is 0.1 μm or more and is less than a thickness of the light-shielding pattern layer.

5. The display device of claim 1, wherein a tip of the adhesive member overlaps at least part of the groove.

6. The display device of claim 1, wherein the window has one surface facing the display panel, and another surface opposite to the one surface, the light-shielding pattern layer being on the one surface of the window.

7. The display device of claim 1, wherein the display panel comprises a first substrate, and a second substrate facing the first substrate and spaced from the first substrate.

8. The display device of claim 1, wherein the display panel comprises an organic light-emitting element.

9. The display device of claim 1, wherein the adhesive member comprises an optically clear resin (OCR).

10. A method for fabricating a display device, the method comprising:
   preparing a window comprising a base substrate, and a light-shielding pattern layer on a peripheral portion of the base substrate;
   forming a groove on the light-shielding pattern layer; and
   laminating a display panel and the window via an adhesive member to form a laminate,
   wherein the base substrate of the laminate comprises a first region overlapping the display panel, and a second region extending and protruding outward from the display panel,
   wherein the light-shielding pattern layer of the laminate is on the first region and the second region,
   wherein the groove of the light-shielding pattern layer of the laminate is aligned with an outer edge surface of the display panel, and
   wherein the groove comprises an inner wall and an outer wall, the inner wall of the groove being aligned with the outer edge surface of the display panel.

11. The method of claim 10, wherein forming the groove comprises irradiating a laser on the basis of the outer edge surface of the display panel.

12. The method of claim 10, wherein forming the groove comprises formation of a scratch, using a knife, on the basis of the outer edge surface of the display panel.

13. The method of claim 10, wherein the groove is formed linearly along the outer edge surface of the display panel.

14. The method of claim 13, wherein the display panel has a rectangular shape, and the groove extends along at least one side of the rectangular shape.

15. The method of claim 10, wherein a width of the groove is 1 μm to 100 μm, and a depth of the groove is 0.1 μm or more and is less than a thickness of the light-shielding pattern layer.

16. The method of claim 10, wherein the window has one surface facing the display panel, and an other surface opposite to the one surface, and
   wherein the method further comprises acquiring data, by ultrasonic measurement on a vicinity of a frame of the laminate, from the other surface of the window after forming the laminate.

17. The method of claim 16, wherein the acquiring the data via ultrasonic measurement comprises acquisition of data about a filling condition of the adhesive member and data about a position of the groove.

18. A method for fabricating a display device, the method comprising:
   preparing a display panel and a window comprising a base substrate and a light-shielding pattern layer, the base substrate comprising a first region on the display panel and overlapping the display panel, a second region extending and protruding outward from the display panel, the light-shielding pattern layer being on the first region and the second region of the base substrate;
   preparing a laminate comprising an adhesive member between the display panel and the window; and
   forming a groove aligned with an outer edge surface of the display panel, in the light-shielding pattern layer.

19. The method of claim 18, wherein the window has one surface facing the display panel, and an other surface opposite to the one surface, and
   wherein the method further comprises acquiring data, by ultrasonic measurement on a vicinity of a frame of the laminate, from the other surface of the window after forming the laminate.

\* \* \* \* \*